United States Patent
Lee et al.

(10) Patent No.: US 6,392,889 B1
(45) Date of Patent: May 21, 2002

(54) FASTENER FOR HEAT SINK

(75) Inventors: Tsung-Lung Lee; Cheng Tien Lai, both of Taipei (TW); Zi Li Zhang, Shenzhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/934,355

(22) Filed: Aug. 21, 2001

(51) Int. Cl.[7] .................................................. H05K 7/20
(52) U.S. Cl. ........................ 361/704; 361/710; 361/719; 361/720; 361/721; 165/80.3; 257/718; 257/719; 257/727; 24/453; 24/458
(58) Field of Search .............................. 361/690, 695, 361/704, 707, 709, 719–721; 257/706, 718–722, 727; 174/16.3; 165/80.2, 80.3; 24/293–296, 458, 453

(56) References Cited

U.S. PATENT DOCUMENTS

| | | | | |
|---|---|---|---|---|
| 5,384,940 A | * | 1/1995 | Soule et al. ................... 24/453 |
| 5,730,210 A | * | 3/1998 | Kou ........................... 165/80.3 |
| 6,055,159 A | * | 4/2000 | Sun ............................. 361/704 |
| 6,061,239 A | * | 5/2000 | Blomquist ................... 361/704 |
| 6,181,559 B1 | * | 1/2001 | Seo ............................. 361/704 |
| 6,307,748 B1 | * | 10/2001 | Lin et al. ..................... 361/704 |

* cited by examiner

Primary Examiner—Leo P. Picard
Assistant Examiner—Boris L. Chervinsky
(74) Attorney, Agent, or Firm—Wei Te Chung

(57) ABSTRACT

A fastener (50) includes a pin (52), a spring (54) and a handle (56). The pin extends through a heat sink (10). The handle is pivotably attached to a top portion of the pin. The pin has a foot (522) extending through a mother board (30) and a supporting board (40) located under the mother board to engage with the supporting board. A CPU (20) is mounted on the mother board. The spring surrounds the pin and is located between a base of the heat sink and the handle. When the handle is rotated from a horizontal position to a vertical position, the handle compresses the spring toward the foot. The spring in turn presses the base of the heat sink against the CPU.

16 Claims, 5 Drawing Sheets

FASTENER FOR HEAT SINK

BACKGROUND OF THE INVENTION

1. Field of the Invention

The present invention relates to fasteners for heat sinks, and particularly to fasteners readily and securely attaching heat sinks to electronic devices.

2. Related Art

Computer electronic devices such as central processing units (CPUs) frequently generate large amounts of heat, which can destabilize operation and cause damage. A heat sink placed in thermal contact with an electronic device mounted on a socket transfers heat from the electronic device through conduction. Oftentimes, the heat sink is secured to the electronic device with a clip.

A conventional clip comprises a spring portion and two downwardly extending legs. Each leg defines an opening. The spring portion is accommodated in a channel defined in an upper portion of a heat sink, and thereby abuts against the heat sink. The opening of each leg engagably receives a corresponding catch formed on a side of a socket, to secure the heat sink on an electronic device mounted on the socket. Contemporary high-speed CPUs are generating more and more heat. Heat sinks are accordingly being made larger and larger. As a result, conventional clips oftentimes cannot securely attach a heat sink to a CPU. The heat sink is prone to disengage or be dislodged from the CPU when it is subjected to shock or vibration during normal use.

To solve the above problem, a pair of clips is often used to secure a heat sink to an electronic device. The heat sink is secured between a pair of retention modules. The clips abut against opposite sides of a base of the heat sink. Opposite legs of each clip engage with corresponding catches formed on opposite sides of the corresponding retention module. However, using retention modules makes the system unduly complicated and costly.

SUMMARY OF THE INVENTION

Accordingly, an object of the present invention is to provide fasteners readily and securely attaching a heat sink to an electronic device.

Another object of the present invention is to provide fasteners which are pre-attached on a heat sink before the heat sink is attached to the electronic device.

To achieve the above-mentioned objects, a fastener in accordance with the present invention comprises a pin, a spring and a handle. The pin extends through a heat sink. The handle is pivotably attached to a top portion of the pin. The pin has a foot extending through a mother board and a supporting board located under the mother board to engage with the supporting board. A CPU is mounted on the mother board. The spring surrounds the pin and is located between a base of the heat sink and the handle. When the handle is rotated from a horizontal position to a vertical position, the handle compresses the spring toward the foot. The spring in turn presses the base of the heat sink against the CPU.

Other objects, advantages and novel features of the present invention will be drawn from the following detailed description of preferred embodiments of the present invention with attached drawings, in which:

DESCRIPTION OF THE PREFERRED EMBODIMENTS

Figure 1:
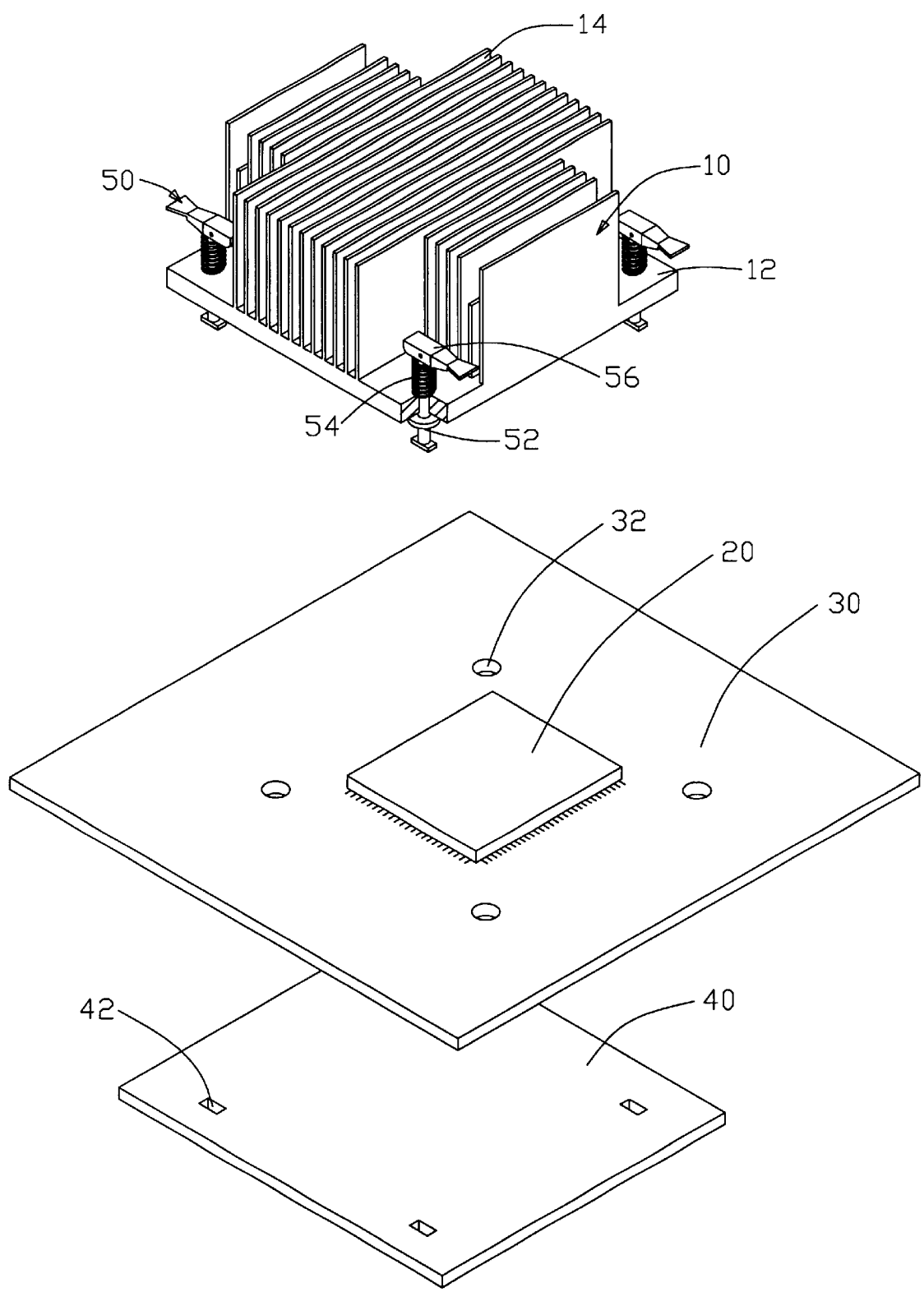
FIG. 1 is a partly assembled view of a heat sink, four fasteners in accordance with a preferred embodiment of the present invention, a mother board, and a supporting board, with part of one corner of a base of the heat sink cut away for clarity, and with only three of the four fasteners visible.

Referring to the attached drawings, FIG. 1 shows three of four fasteners 50 each in accordance with a preferred embodiment of the present invention. The fasteners 50 secure a heat sink 10 to a central processing unit (CPU) 20 mounted on a mother board 30. A supporting board 40 is for mounting under the mother board 30, to reinforce the mother board 30.

The heat sink 10 comprises a generally rectangular base 12. A plurality of fins 14 extends upwardly from a top surface of the base 12, except at four corner portions of the base 12. Four holes (not labeled) are respectively defined in the four corner portions of the base 12, for extension of the fasteners 50 respectively therethrough. The mother board 30 defines four apertures 32, corresponding to the holes of the base 12. The supporting board 40 defines four openings 42, corresponding to the apertures 32 of the mother board 30. The openings 42 may be rectangular, elliptical, cross-shaped, or some other suitable shape. For convenience, the openings 42 will be described as being rectangular hereafter.

Figure 2:
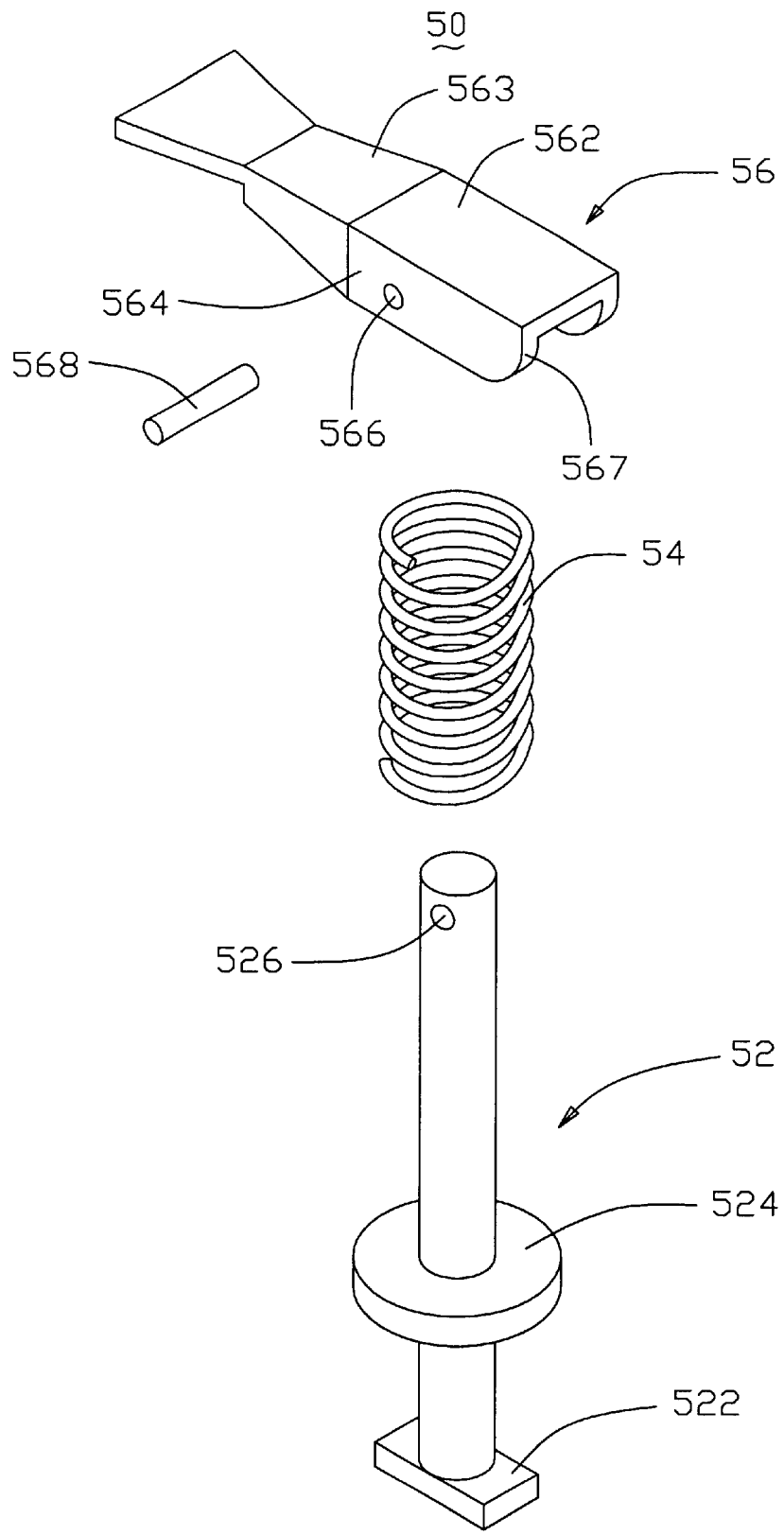
FIG. 2 is an exploded view of one fastener of FIG. 1.

Referring also to FIG. 2, each fastener 50 comprises a pin 52, a spring 54 and a handle 56. The pin 52 comprise; a foot 522 formed at a bottom end thereof. The foot 522 may be rectangular, elliptical, cross-shaped, or some other suitable shape. A shape of the foot 522 corresponds to a shape of the corresponding opening 42 of the supporting board 40. For convenience, the feet 522 will be described as being rectangular hereafter. A size of the foot 522 is slightly smaller than a size of the corresponding opening 42 of the supporting board 40, and also slightly smaller than a size of the corresponding aperture 32 of the mother board 30. The foot 522 is thereby extendable through the corresponding aperture 32 and the corresponding opening 42. An annular stop 524 is formed around a circumferential surface of the pin 52, spaced from but proximate to the foot 522. The annular stop 524 is thinner than the CPU 20 attached on the mother board 30 (see FIG. 4). A first pivot hole 526 is defined in the pin 52, near a top end thereof.

The handle 56 comprises a pressing portion 562, and an actuating portion 563 extending integrally from one end of the pressing portion 562. A pair of side walls 564 depends from opposite longitudinal sides of the pressing portion 562. The pressing portion 562 is thus generally U-shaped in profile. A second pivot hole 566 is defined near an end of each side wall 564 proximate to the actuating portion 563, such that the second pivot holes 566 are coaxial. A rounded corner is formed at a free end 567 of each side wall 564, at a junction of the free end 567 and an edge of the side wall 564 distal from the pressing portion 562. An axle 568 is extendable through the first pivot hole 526 of the pin 52 and receivable in the second pivot holes 566 of the handle 56.

Figure 3:
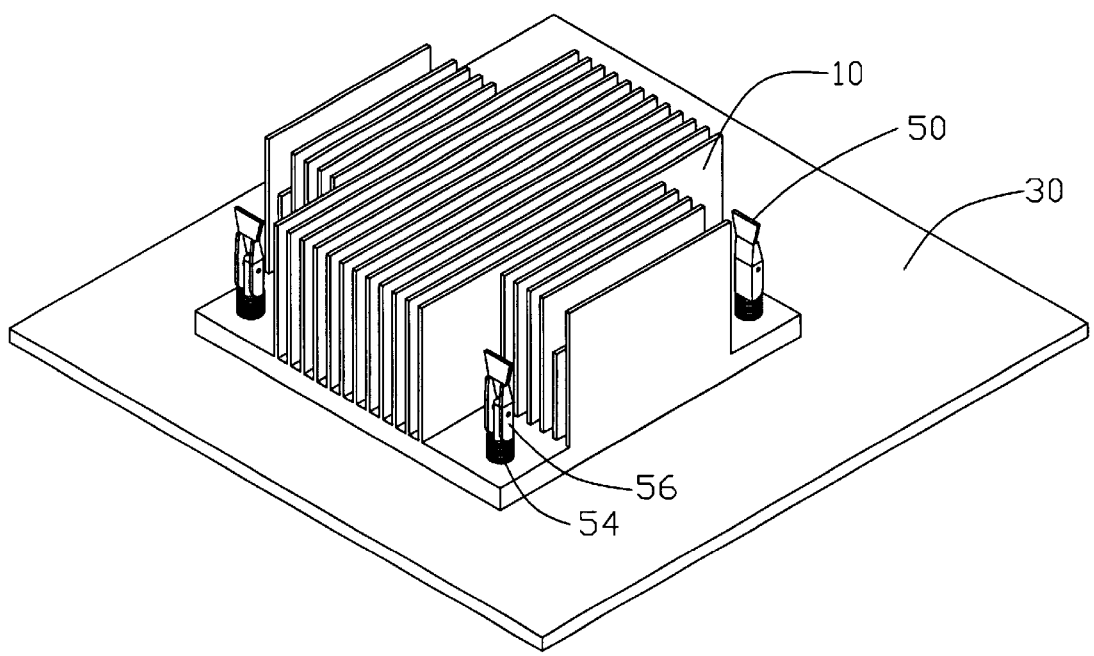
FIG. 3 is a fully assembly view of FIG. 1.
Figure 4:
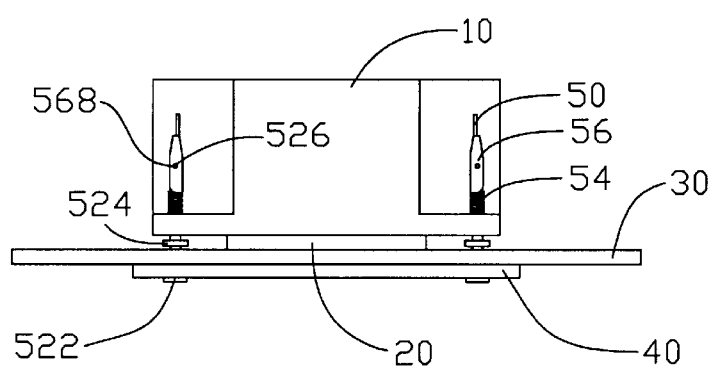
FIG. 4 is a side elevational view of FIG. 3.

Referring particularly to FIGS. 3 and 4, in assembly, an upper portion of each pin 52 is extended through a corresponding hole of the base 12 from a bottom end of the base 12. One spring 54 is slid over and around the upper portion of each pin 52, such that a bottom end of the spring 54 contacts a top surface of the base 12. The handle 56 is then attached to the top portion of the pin 52. The axle 568 is extended through the first pivot hole 526 of the pin 52 and the second pivot holes 566 of the handle 56. In this position, the handle 56 is horizontal. The stop 524 is located under a bottom surface of the base 12, thereby preventing the fastener 50 from disengaging from the heat sink 10. The fasteners 50 are thus attached on the heat sink 10.

The mother board 30 is then placed on the supporting board 40. The apertures 32 of the mother board 30 are aligned with the corresponding openings 42 of the supporting board 40. The combination of the heat sink 10 and the fasteners 50 is placed on the CPU 20. The foot 522 of each fastener 50 is extended through the corresponding aperture 32 and opening 42. The actuating portion 563 of each handle 56 is then held, and the handle 56 is rotated 90 degrees in a horizontal plane. The rectangular foot 522 of the fastener 52 is thereby oriented perpendicular to the corresponding rectangular opening 42, and abuts a bottom surface of the supporting board 40. The handle 56 is then rotated upwardly 90 degrees to a vertical position. The free end 567 of the handle 50 abuts against a top of the spring 54. The spring 54 is thereby compressed, and in turn presses the base 12 of the heat sink 10 against the CPU 20. The heat sink 10 is thus securely attached to the CPU 20.

Figure 5:
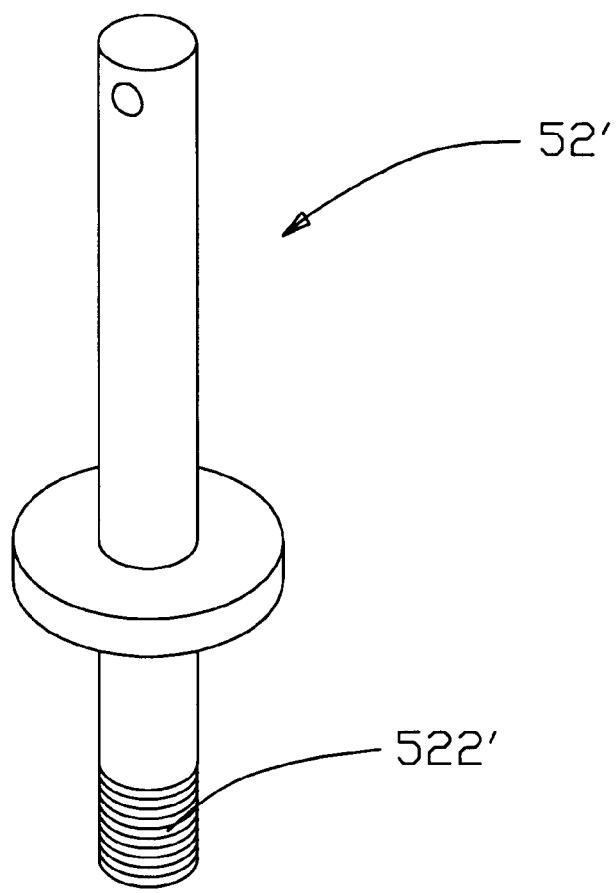
FIG. 5 is a perspective view of a pin of a fastener in accordance with an alternative embodiment of the present invention, together with a nut.

FIG. 5 shows a pin 52' of a fastener in accordance with an alternative embodiment of the present invention, together with a nut 60. A foot 522' of each pin 52' is columnar. A screw thread is formed in a circumferential surface of the foot 522', for engaging with the nut 60. The supporting board for use in this embodiment defines four circular openings to replace the rectangular openings 42 of the preferred embodiment, for extension of the respective feet 522' therethrough. The feet 522' are engaged with the respective nuts 60. The nuts 60 abut against the bottom surface of the supporting board.

Figure 6:
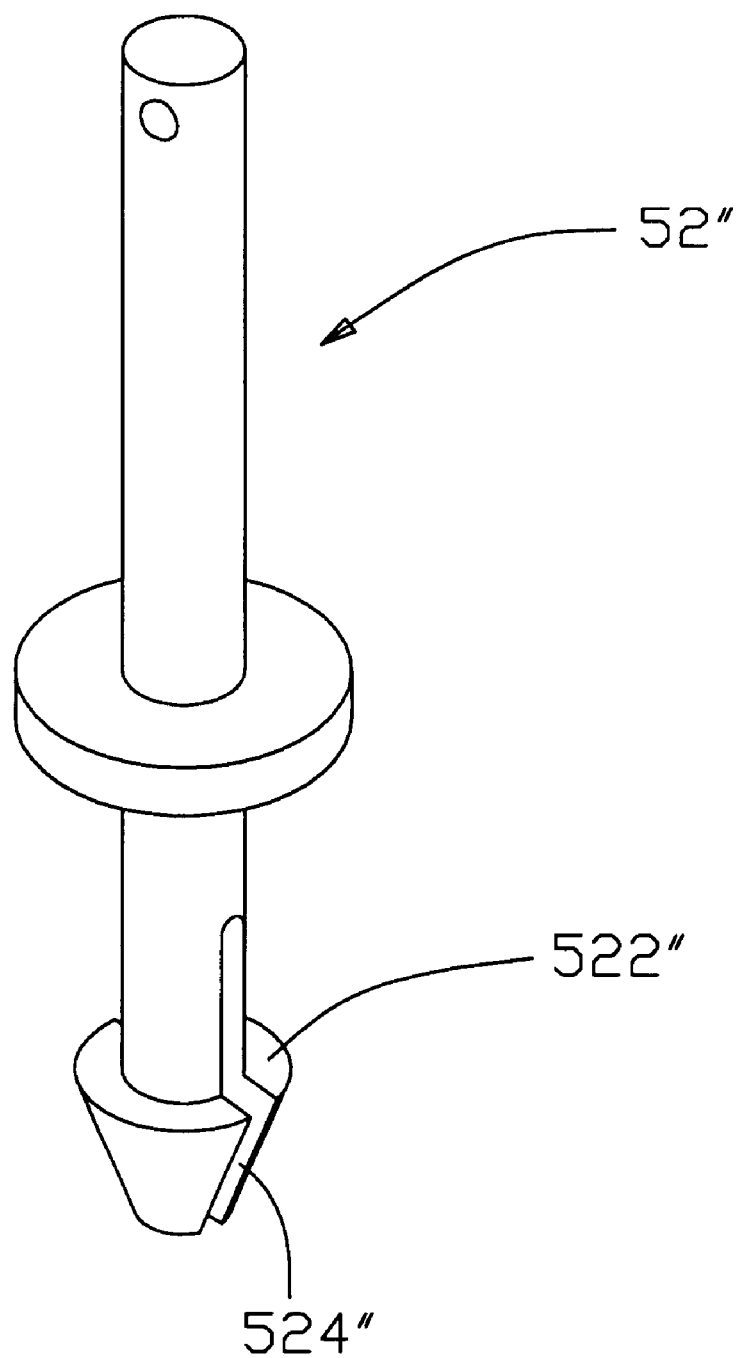
FIG. 6 is a perspective view of a pin of a fastener in accordance with a further alternative embodiment of the present invention.

FIG. 6 shows a pin 52" of a fastener in accordance with a further alternative embodiment of the present invention. A foot 522" of each pin 52" is cone-shaped. A slot 524" is defined through a combined middle of the foot 522" and lower portion of the pin 52", for facilitating elastic deformation of the foot 522". The supporting board for use in this embodiment defines four circular openings to replace the rectangular openings 42 of the preferred embodiment, for extension of the respective feet 522" therethrough. The feet 522' thereby deformably engage with the supporting board.

In the present invention, the heat sink 10 is attached to the CPU 20 by holding and rotating the actuating portions 563 of the handles 56. The pressing portions 562 of the handles 56 compress the springs 54 and thereby press the heat sink 10 against the CPU 20. Thus the heat sink 10 is readily and securely attached to the CPU 20. Furthermore, the fasteners 50 can be pre-assembled onto the heat sink 10 prior to the heat sink 10 being attached to the CPU 20. It is most convenient for a user to attach the pre-combined heat sink 10 and fasteners 50 to the mother board 30 and the supporting board 40. Moreover, retention modules are not needed, thereby reducing assembly time and costs.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A fastener adapted to attach a heat sink to an electronic device mounted on a mother board, the fastener comprising:
   a pin adapted to extend through the heat sink, the pin comprising a foot adapted to engage with the mother board;
   a handle pivotably attached to a top portion of the pin; and
   a spring surrounding the pin and located between the foot and the handle,
   wherein when the handle is rotated from a horizontal position to a vertical position, the spring is compressed toward the foot by the handle to thereby press the heat sink against the electronic device.

2. The fastener as claimed in claim 1, wherein a stop spaced from the foot extends from a circumferential surface of the pin, the stop being adapted to be located under the heat sink to prevent the fastener from disengaging from the heat sink.

3. The fastener as claimed in claim 1, wherein the pin defines a first pivot hole in a top portion thereof, the handle comprises a pressing portion having a pair of side walls, and the side walls define a pair of coaxial second pivot holes, an axle extending through the first pivot hole and the second pivot holes and thereby pivotably attaching the handle to the pin.

4. The fastener as claimed in claim 3, wherein the handle further comprises an actuating portion integrally extending from one end of the pressing portion, and the side walls at an opposite end of the pressing portion have rounded corners.

5. The fastener as claimed in claim 1, wherein the foot of the pin is rectangular.

6. The fastener as claimed in claim 1, wherein the foot of the pin is column-shaped, the foot having a thread engaging with a nut.

7. The fastener as claimed in claim 1, wherein the foot of the pin is cone-shaped, a slot being defined through the foot and a lower portion of the pin for facilitating elastic deformation of the foot.

8. An electronic device assembly comprising:
   a mother board with an electronic device mounted thereon, the mother board defining at least two apertures surrounding the electronic device;
   a supporting board mounted under the mother board, the supporting board defining at least two openings corresponding to the at least two apertures;
   a heat sink comprising a base contacting the electronic device and a plurality of fins extending upwardly from the base, the base defining at least two holes corresponding to the at least two apertures; and
   at least two fasteners securing the heat sink to the electronic device, each fastener comprising a pin extending through a corresponding hole of the heat sink, a spring surrounding the pin, and a handle pivotably attached to a top portion of the pin, the pin having a foot extending through a corresponding aperture and opening to engage with the supporting board, the spring being located between the base and the handle,
   wherein when the handle is rotated from a horizontal position to a vertical position, the spring is compressed to thereby press the heat sink against the electronic device.

9. The electronic device assembly as claimed in claim 8, wherein the foot of each pin is rectangular, and the corresponding opening is rectangular, and wherein when the handle is rotated in a generally horizontal plane the foot engages with the supporting board at the corresponding opening.

10. The electronic device assembly as claimed in claim 8, wherein the foot of each pin is elliptical, and the corresponding aperture and corresponding opening are elliptical, and wherein when the handle is rotated in a generally horizontal plane the foot engages with the supporting board at the corresponding opening.

11. The electronic device assembly as claimed in claim 8, wherein the foot of each pin is cross-shaped and the corresponding opening is cross-shaped, and wherein when the handle is rotated in a generally horizontal plane the foot engages with the supporting board at the corresponding opening.

12. The electronic device assembly as claimed in claim 8, wherein the foot of each pin is column-shaped, the foot has a thread engaging with a nut, and the nut abuts a bottom surface of the supporting board.

13. The electronic device assembly as claimed in claim 8, wherein the foot of each pin is cone-shaped, a slot being defined through the foot and a lower portion of the pin for facilitating elastically deformable extension of the foot through the corresponding aperture and opening.

14. The electronic device assembly as claimed in claim 8, wherein a stop spaced from the foot extends from a circumferential surface of each pin, the stop being located under the base of the heat sink for preventing the fastener from disengaging from the heat sink.

15. The electronic device assembly as claimed in claim 8, wherein each pin defines a first pivot hole in the top portion thereof, the handle comprises a pressing portion having a pair of side walls, and the side walls define a pair of coaxial second pivot holes, an axle extending through the first pivot hole and the second pivot holes and thereby pivotably attaching the handle to the pin.

16. The electronic device assembly as claimed in claim 15, wherein the handle further comprises an actuating portion integrally extending from one end of the pressing portion, and the side walls at an opposite end of the pressing portion have rounded corners.

* * * * *